(12) United States Patent
Miyoshi

(10) Patent No.: US 9,973,858 B2
(45) Date of Patent: May 15, 2018

(54) ELECTRO-ACOUSTIC CONVERSION FILM AND DIGITAL SPEAKER

(71) Applicant: FUJIFILM Corporation, Tokyo (JP)

(72) Inventor: Tetsu Miyoshi, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days. days.

(21) Appl. No.: 15/394,387

(22) Filed: Dec. 29, 2016

(65) Prior Publication Data

US 2017/0111746 A1    Apr. 20, 2017

Related U.S. Application Data

(63) Continuation of application No. PCT/JP2015/068584, filed on Jun. 26, 2015.

(30) Foreign Application Priority Data

Jun. 30, 2014 (JP) .................................. 2014-134550

(51) Int. Cl.
*H04R 17/00* (2006.01)
*H01L 41/37* (2013.01)
(Continued)

(52) U.S. Cl.
CPC ......... *H04R 17/005* (2013.01); *H01L 41/047* (2013.01); *H01L 41/09* (2013.01);
(Continued)

(58) Field of Classification Search
CPC . H04R 1/005; H04R 7/04; H04R 7/06; H04R 17/00; H04R 17/005; H04R 17/025;
(Continued)

(56) References Cited

U.S. PATENT DOCUMENTS 5,400,414 A * 3/1995 Thiele .................... G03B 21/56
                                                       348/E5.13
9,440,259 B2 * 9/2016 Miyoshi ............... H04R 17/005
(Continued)

FOREIGN PATENT DOCUMENTS

JP     58-121897 A    7/1983
JP     59-95796 A     6/1984
(Continued)

OTHER PUBLICATIONS

International Preliminary Report on Patentabillty and the English translation of the International Searching Authority (Forms PCT/IB/338, PCT/IB/373 and PCT/ISA/237), dated Jan. 12, 2017, for International Application No. PCT/JP2015/068584.

(Continued)

*Primary Examiner* — Joshua Kaufman
(74) *Attorney, Agent, or Firm* — Birch, Stewart, Kolasch & Birch, LLP

(57) ABSTRACT

Provided is an electro-acoustic conversion film that is suitably used for a digital speaker or the like, and that includes a polymer composite piezoelectric body formed by dispersing piezoelectric particles in a viscoelastic matrix formed of a polymer material having viscoelasticity at room temperature, and thin-film electrodes provided on both surfaces of the polymer composite piezoelectric body, and at least one of the thin-film electrodes is divided into a plurality of regions of which an area increases by $2^n$ times (n is a natural number including 0). Thus, a digital speaker in which reverberation or crosstalk between segments is suppressed is obtained.

12 Claims, 9 Drawing Sheets

(51) Int. Cl.
*H01L 41/047* (2006.01)
*H01L 41/09* (2006.01)
*H04R 1/00* (2006.01)
*H04R 7/06* (2006.01)
*H01L 41/18* (2006.01)
*H01L 41/257* (2013.01)

(52) U.S. Cl.
CPC ............ *H01L 41/37* (2013.01); *H04R 1/005* (2013.01); *H04R 7/06* (2013.01); *H01L 41/183* (2013.01); *H01L 41/257* (2013.01); *H04R 2307/025* (2013.01)

(58) Field of Classification Search
CPC . H04R 31/00; H04R 2307/025; H01L 41/047; H01L 41/0805; H01L 41/09; H01L 41/0973; H01L 41/29
See application file for complete search history.

(56) References Cited

U.S. PATENT DOCUMENTS

| | | | | |
|---|---|---|---|---|
| 9,621,997 B2* | 4/2017 | Miyoshi | ............... | H01L 41/183 |
| 9,635,467 B2* | 4/2017 | Miyoshi | ............... | H04R 17/005 |
| 9,723,412 B2* | 8/2017 | Miyoshi | ................... | H04R 3/04 |
| 9,761,784 B2* | 9/2017 | Miyoshi | ............. | H01L 41/0805 |
| 2006/0276946 A1* | 12/2006 | Kaneko | .................. | G01N 3/48 |
| | | | | 701/45 |
| 2011/0026757 A1* | 2/2011 | Takahashi | .............. | H04R 7/125 |
| | | | | 381/397 |
| 2014/0210309 A1 | 7/2014 | Miyoshi | | |
| 2015/0155474 A1* | 6/2015 | Tanimoto | .............. | H01L 41/083 |
| | | | | 310/332 |
| 2016/0008852 A1* | 1/2016 | Miyoshi | ............... | H04R 17/005 |
| | | | | 359/444 |
| 2016/0014527 A1* | 1/2016 | Miyoshi | ............... | H04R 17/005 |
| | | | | 381/190 |
| 2016/0020380 A1* | 1/2016 | Miyoshi | ................ | H01L 41/183 |
| | | | | 252/62.9 PZ |
| 2016/0021465 A1* | 1/2016 | Miyoshi | ................... | H04R 3/04 |
| | | | | 381/98 |
| 2017/0018700 A1* | 1/2017 | Miyoshi | ............... | H04R 17/005 |
| 2017/0019737 A1* | 1/2017 | Miyoshi | ............... | H04R 17/005 |
| 2017/0111745 A1* | 4/2017 | Miyoshi | ................ | H01L 41/047 |
| 2017/0111746 A1* | 4/2017 | Miyoshi | .................. | H01L 41/37 |
| 2017/0331030 A1* | 11/2017 | Inoue | .................... | H01L 41/183 |
| 2017/0366902 A1* | 12/2017 | Miyoshi | .................. | H04R 7/16 |
| 2017/0373243 A1* | 12/2017 | Ozawa | ................. | H01L 41/183 |
| 2018/0014096 A1* | 1/2018 | Miyoshi | .................. | H04R 1/02 |

FOREIGN PATENT DOCUMENTS

| | | |
|---|---|---|
| JP | 59-95799 A | 6/1984 |
| JP | 60-111200 U | 7/1985 |
| JP | 60-184398 U | 12/1985 |
| JP | 2014-14063 A | 1/2014 |

OTHER PUBLICATIONS

"Journal of the Institute of Electrostatics Japan", vol. 11, No. 3, 1987, pp. 150-157.
International Search Report for PCT/JP2015/068584 (PCT/ISA/210) dated Sep. 29, 2015.
Written Opinion of the International Searching Authority for PCT/JP2015/068584 (PCT/ISA/237) dated Sep. 29, 2015.

* cited by examiner

ELECTRO-ACOUSTIC CONVERSION FILM AND DIGITAL SPEAKER

CROSS-REFERENCE TO RELATED APPLICATIONS

This application is a Continuation of PCT International Application No. PCT/JP2015/068584 filed on Jun. 26, 2015, which claims priority under 35 U.S.C. § 119(a) to Japanese Patent Application No. 2014-134550 filed on Jun. 30, 2014. The above application is hereby expressly incorporated by reference, in its entirety, into the present application.

BACKGROUND OF THE INVENTION

1. Field of the Invention

The present invention relates to an electro-acoustic conversion film used in a digital acoustic device such as a digital speaker, and to a digital speaker using the same.

2. Description of the Related Art

A digital speaker is a speaker to which a digital signal (pulse) is directly input so as to obtain a conventional analog acoustic output. Here, an analog signal is sampled at regular intervals using a "sampling theorem", and a pulse having a sample value is applied to the speaker and subjected to digital/analog conversion (D/A conversion).

An electrodynamic speaker using a permanent magnet essentially has a D/A conversion function, and a large number of digital speakers may be considered using the function.

In order to perform the D/A conversion, it is necessary to have an acoustic output value corresponding to all of sample values of an input pulse. Specifically, it is necessary to perform weighting of output up to $2^{N-1}$ for a speaker for a signal system having a pulse with a maximum of N bits. For example, in an 8-bit signal system, a weighted output change is required from a minimum value $2^0$ (=1) to a maximum value $2^7$ (=128).

For this weighting method, "multi-unit scheme" and a "multi-voice coil scheme" are known.

The "multi-unit scheme" is a scheme of performing acoustic synthesis in a space using a total of n units each having a weight corresponding to one bit. On the other hand, the "multi-voice coil scheme" is a scheme of performing weighting in a voice coil execution winding length Ω.

However, in the "multi-unit scheme", there is a problem, for example, in that a larger number of electrodynamic speakers are required as the number of bits increases. Moreover, in the "multi-voice coil system", there is a problem, for example, in that a loss of magnetic energy increases with a decrease in space factor as the number of bits increases.

On the other hand, a digital speaker using a piezoelectric speaker different from an electrodynamic speaker has been proposed.

For example, JP1984-95796A (JP-S59-95796A) and JP1984-95799A (JP-S59-95799A) describe a digital speaker including a vibration plate formed of a piezoelectric element between a pair of flat electrodes, in which one of the flat electrodes includes a plurality of unit electrodes radially divided at substantially a constant angle, and the unit electrodes are grouped so that an area is proportional to a weight of each bit digit of a digital signal.

Further, the Journal of the Institute of Electrostatics Japan (Vol. 11 @ No. 3, 1987) pp. 150-157 discloses a digital speaker in which an area of an electrode deposited on a surface of a polymer piezoelectric material is concentrically divided into seven such that it increases in size twofold from a center to the outside.

SUMMARY OF THE INVENTION

A piezoelectric element having a unimorph structure including a piezoelectric ceramic and a vibration plate, which is used in a digital speaker described in JP1984-95796A (JP-S59-95796A) or JP1984-95799A (JP-S59-95799A) generates sound waves through surface mechanical vibration. Therefore, high-bit realization is difficult because of a unique resonance frequency and a narrow frequency band. Further, in a digital speaker using a unimorph type piezoelectric element, reverberation is easily generated in pulse driving. Further, in the digital speaker using a unimorph type piezoelectric element, since crosstalk easily occurs between respective divided unit electrodes, there is a problem in that noise increases. The crosstalk between the unit electrodes is interference between the respective electrodes.

On the other hand, in a digital speaker described in the Journal of the Institute of Electrostatics Japan (Vol. 11 @ No. 3, 1987) pp. 150-157, there is no problem caused by surface mechanical vibration since a vibration plate is not used.

However, since a polymer piezoelectric material represented by uniaxially stretched PVDF (polyvinylidene fluoride) used in a digital speaker described in the Journal of the Institute of Electrostatics Japan (Vol. 11 @ No. 3, 1987) pp. 150-157 has a loss tangent (Tan δ) which is as small as approximately 0.02, reverberation easily occurs and crosstalk between respective segments easily occurs in pulse driving. Accordingly, there is a problem in that noise increases. Between respective segments is between respective divided electrodes.

Further, in the case of uniaxially stretched PVDF, since there is an in-plane anisotropy in piezoelectric characteristics, for example, even when concentric segmentation is performed, vibration cannot concentrically occur. Accordingly, a digital speaker with good sound quality is not obtained.

An object of the present invention is to solve the problems of such related art and to provide an electro-acoustic conversion film suitable for a digital speaker in which reverberation hardly occurs even when pulse driving is performed, and crosstalk between respective divided electrodes can be suppressed.

In JP2014-14063A, an electro-acoustic conversion film in which a piezoelectric ceramic is dispersed in a matrix having viscoelasticity at room temperature has been proposed.

This electro-acoustic conversion film has a large frequency distribution in an elastic modulus, and has hard behave with vibration in an audio band (100 Hz to 10 kHz) and soft behavior with vibration of a few Hz or less. Further, this electro-acoustic conversion film has an appropriately large loss tangent with respect to vibration at all frequencies of 20 kHz or less, and the loss tangent in this audio band is as very large as 0.09 to 0.35.

The present invention realizes a high sound quality piezoelectric digital speaker in which noise caused by reverberation and crosstalk is reduced by using this electro-acoustic conversion film in a vibration plate of the digital speaker as a result of intensive studies focused on a loss tangent in an audio band of the electro-acoustic conversion film being very large.

The present invention provides an electro-acoustic conversion film suitable for a digital speaker in which reverberation hardly occurs even when pulse driving is performed, and crosstalk between respective divided electrodes can be suppressed, which uses this electro-acoustic conversion film, and a digital speaker using this electro-acoustic conversion film.

That is, the electro-acoustic conversion film of the present invention provides an electro-acoustic conversion film comprising a polymer composite piezoelectric body formed by dispersing piezoelectric particles in a viscoelastic matrix formed of a polymer material having viscoelasticity at room temperature, and thin-film electrodes provided on both surfaces of the polymer composite piezoelectric body, in which at least one of the thin-film electrodes is divided into a plurality of regions of which an area increases by $2^n$ times (n is a natural number increasing by 1 and including 0), and wherein a loss tangent (Tan δ) at 100 Hz to 10 kHz at a temperature of 0° C. to 50° C. is 0.09 to 0.35.

In the electro-acoustic conversion film of the present invention, it is preferable for the plurality of divided regions of the electrode to be a plurality of annular regions which are concentric to each others.

Further, it is preferable for the plurality of divided regions of the electrode have a circular region concentric to the annular regions on an inner side of the smallest annular region.

Further, it is preferable for the plurality of divided regions of the electrode to be a plurality of radially divided regions.

Further, it is preferable for the plurality of radially divided regions to be radially divided regions in straight lines passing through one point, and for regions to be formed as two symmetrical regions that are point symmetrical to the one point.

Further, it is preferable for the electro-acoustic conversion film to further comprise protective layers formed on both surfaces of the thin-film electrode.

Further, it is preferable for a maximum value at which a loss tangent (Tan δ) at a frequency of 1 Hz from dynamic viscoelasticity measurement of the polymer material is 0.5 or more to be present in a temperature range of 0° C. to 50° C.

Further, it is preferable for a storage elastic modulus (E') at a frequency of 1 Hz from dynamic viscoelasticity measurement of the electro-acoustic conversion film to be 10 to 30 GPa at 0° C. and 1 to 10 GPa at 50° C.

Further, it is preferable for glass transition temperature at a frequency of 1 Hz of the polymer material to be 0° C. to 50° C.

Further, it is preferable for the polymer material to have a cyanoethyl group.

Further, it is preferable for the polymer material to be cyanoethylated polyvinyl alcohol.

Further, a digital speaker of the present invention provides a digital speaker using the electro-acoustic conversion film of the present invention.

According to the electro-acoustic conversion film of the present invention, even when pulse driving is performed by a parallel PCM digital signal, reverberation hardly occurs and crosstalk between the divided electrodes (between segments) also hardly occurs. Therefore, a high sound quality digital speaker in which noise is reduced can be obtained.

Further, according to the electro-acoustic conversion film of the present invention, a flexible digital speaker can be achieved and even when the flexible digital speaker is bent, a change in sound quality due to a curvature or a bending direction is small.

BRIEF DESCRIPTION OF THE DRAWINGS

FIG. 1A is a plan view, and FIG. 1B is a cross-sectional view taken along a line b-b of FIG. 1A.

DESCRIPTION OF THE PREFERRED EMBODIMENTS

Hereinafter, an electro-acoustic conversion film and a digital speaker of the present invention will be described in detail on the basis of preferred examples illustrated in the accompanying drawings.

Figure 1A:
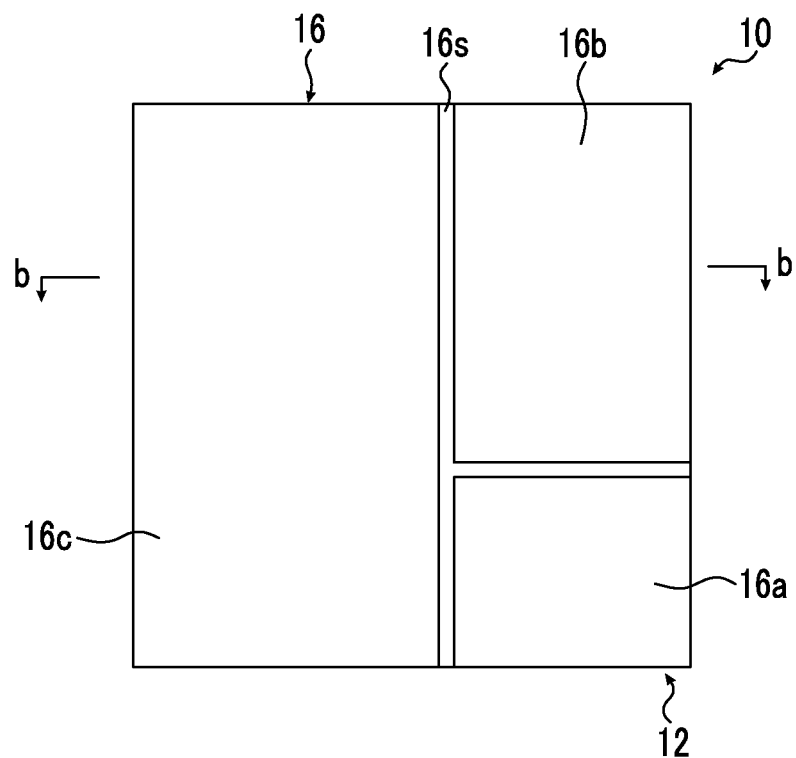
FIGS. 1A and 1B are conceptual views of an example of an electro-acoustic conversion film of the present invention.
Figure 1B:
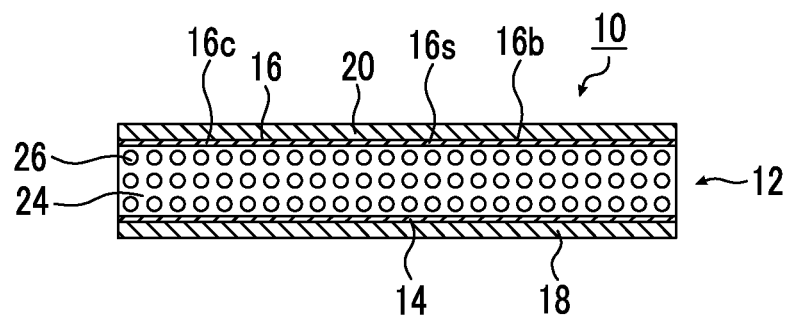

FIGS. 1A and 1B conceptually illustrate an example of the electro-acoustic conversion film of the present invention. In the following description, the electro-acoustic conversion film is also simply referred to as a conversion film.

FIG. 1A is a top view, and FIG. 1B is a sectional view taken along a line b-b of FIG. 1A. Further, in order to clearly illustrate a configuration of the conversion film, an upper protective layer 20 is omitted in FIG. 1A, and hatching is partially omitted in FIG. 1B.

The conversion film 10 illustrated in FIGS. 1A and 1B includes a piezoelectric layer 12, a lower thin-film electrode 14, an upper thin-film electrode 16, a lower protective layer 18, and an upper protective layer 20. The upper thin-film electrode 16 is divided into three regions including a first segment 16a, a second segment 16b, and a third segment 16c.

The lower thin-film electrode 14 is formed on one surface of the piezoelectric layer 12, and the upper thin-film electrode 16 is formed on a surface opposite to the lower thin-film electrode 14 of the piezoelectric layer 12. Further, the lower protective layer 18 is formed on the lower thin-film electrodes 14 (surface), and the upper protective layer 20 is formed on the upper thin-film electrode 16.

Wirings are connected to the lower thin-film electrode 14 and the upper thin-film electrode 16 of such a conversion film 10, and an amplifier for driving is connected to the wirings to constitute the digital speaker of the present invention. In the upper thin-film electrodes 16, a wiring is connected to each segment.

The connection of the wirings to the lower thin-film electrodes 14 and the upper thin-film electrode 16 may be performed using a known method of connecting wirings for driving to thin-film electrodes. Further, for the amplifier for driving, various known amplifiers for reproducing a PCM digital signal used in a digital speaker are available.

In the conversion film 10, the piezoelectric layer 12 is formed of a polymer composite piezoelectric body.

In the present invention, the piezoelectric layer 12, that is, the polymer composite piezoelectric body is obtained by dispersing piezoelectric particles 26 in a viscoelastic matrix 24 formed of a polymer material having viscoelasticity at room temperature, as illustrated in FIG. 1B. As will be described below, the piezoelectric layer 12 is preferably polarized.

In this specification, the "room temperature" refers to a temperature range of about 0° C. to 50° C.

The conversion film 10 of the present invention is suitably used for a digital speaker having flexibility, such as a digital speaker for a flexible display. Here, it is preferable for the polymer composite piezoelectric body (piezoelectric layer 12) used in a digital speaker having flexibility to have the following characteristics:

(i) Flexibility

For example, when a conversion film is gripped in a state where the conversion film is loosely bent with a paper sense like a newspaper or a magazine that is portable, the conversion film is constantly subjected to large bending deformation that is relatively slow at a few Hz or less from the outside. In this case, when a polymer composite piezoelectric body is rigid, large bending stress is correspondingly generated, cracks occur at an interface between a polymer matrix and piezoelectric particles, and the polymer composite piezoelectric body may be eventually destructed. Thus, appropriate softness is required for a polymer composite piezoelectric body. Further, if strain energy can be diffused as heat to the outside, a stress can be relaxed. Therefore, an appropriately great loss tangent of the polymer composite piezoelectric body is required.

(ii) Sound Quality

In a speaker, piezoelectric particles are vibrated at a frequency in an audio band of 20 Hz to 20 kHz, an entire vibration plate (polymer composite piezoelectric body) is integrally vibrated by vibration energy, and sound is reproduced. Therefore, appropriate hardness is required in the polymer composite piezoelectric body in order to increase transmission efficiency of the vibration energy. Further, if a frequency characteristic of the speaker is smooth, the amount of change in the sound quality when a lowest resonance frequency $f_0$ is changed due to a change in curvature is also reduced. Therefore, an appropriately great loss tangent of the polymer composite piezoelectric body is required.

In summary, a polymer composite piezoelectric body used in a speaker having flexibility is required to have hard behave with vibration at 20 Hz to 20 kHz and soft behavior with vibration at several Hz or less. Further, an appropriate great loss tangent of the polymer composite piezoelectric body against vibration at all frequencies of 20 kHz or less is required.

In general, a solid polymer has a viscoelasticity relaxation mechanism, and a molecular motion of a large scale with temperature increase or frequency decrease is observed as a decrease (relaxation) in a storage elastic modulus (Young's modulus) or a maximum (absorption) of a loss elastic modulus.

Particularly, relaxation caused by Micro-Brownian motion of molecular chains of an amorphous region is referred to as main dispersion, and a very large relaxation phenomenon is observed. Temperature at which the main dispersion occurs is a glass transition point (Tg), and a most viscoelasticity relaxation mechanism appears conspicuously.

In the polymer composite piezoelectric body (piezoelectric layer 12), a polymer material having a glass transition point at room temperature, in other words, by using a polymer material having viscoelasticity at room temperature in a matrix, a polymer composite piezoelectric body that has hard behave with vibration at 20 Hz to 20 kHz and soft behavior with slow vibration at several Hz or less is realized. In particular, it is preferable for the polymer material in which the glass transition temperature at a frequency of 1 Hz is at room temperature to be used in a matrix of the polymer composite piezoelectric body, for example, in that such a behavior is suitably expressed.

Various known materials are available as the polymer material having viscoelasticity at room temperature. Preferably, a polymer material in which a maximum value of the loss tangent Tan δ at a frequency of 1 Hz by dynamic viscoelasticity test is 0.5 or more at room temperature is used.

Thus, when the polymer composite piezoelectric body is slowly bent by external force, stress concentration of a polymer matrix/piezoelectric particle interface in a maximum bending moment portion is mitigated, and high flexibility can be expected.

Further, it is preferable for a storage elastic modulus (E') at a frequency of 1 Hz due to dynamic viscoelasticity measurement of the polymer material to be 100 MPa or more at 0° C. and 10 MPa or less at 50° C.

Accordingly, a bending moment that is generated when the polymer composite piezoelectric body is slowly bent due to external force can be reduced, and the polymer composite piezoelectric body can have hard behave with acoustic vibration at 20 Hz to 20 kHz.

Further, it is more preferable for a relative dielectric constant of the polymer material to be 10 or more at 25° C. Thus, when a voltage is applied to the polymer composite piezoelectric body, a higher electric field is applied to the piezoelectric particles in the polymer matrix. Accordingly, a large deformation amount can be expected.

However, on the other hand, if ensuring of excellent moisture resistance is considered, it is preferable for the relative dielectric constant of the polymer material to be 10 or less at 25° C.

As polymer materials satisfying such conditions, cyanoethylated polyvinyl alcohol (cyanoethylated PVA), polyvinyl acetate, polyvinylidene chloride co-acrylonitrile, polystyrene-vinyl polyisoprene block copolymer, polyvinyl methyl ketone, and polybutyl methacrylate, and the like are exemplified. Moreover, as the polymer materials, commercially available products such as HYBRAR-5127 (manufactured by Kuraray Co., Ltd.) are also suitably available. Among them, a polymer material having a cyanoethyl group is preferably used, and the cyanoethylated PVA is more preferably used.

The polymer materials may be used alone, or a plurality of kinds of polymer materials may be used in combination (mixture).

The viscoelastic matrix 24 using such a polymer material having viscoelasticity at room temperature, a plurality of polymer materials may be used in combination, if necessary.

That is, other dielectric polymer materials may be added to the viscoelastic matrix 24, in addition to the viscoelastic material such as cyanoethylated PVA, for the purpose of adjustment of the dielectric properties or mechanical properties, if necessary.

As the dielectric polymer materials that can be added, fluorinated polymer such as polyvinylidene fluoride, vinylidene fluoride-tetrafluoroethylene copolymer, vinylidene fluoride-trifluoroethylene copolymer, polyvinylidene fluoride-trifluoroethylene copolymer, and polyvinylidene fluoride-tetrafluoroethylene copolymer, polymer having cyano groups such as vinylidene cyanide-vinyl acetate copolymer, cyanoethyl cellulose, cyanoethyl hydroxy sucrose, cyanoethyl hydroxy cellulose, cyanoethyl hydroxy pullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethylpullulan, cyanoethyl polyhydroxymethylene, cyano ethyl glycidol pullulan, cyanoethyl sucrose, and cyanoethyl sorbitol, or cyanoethyl groups, synthetic rubber such as nitrile rubber or chloroprene rubber, and the like are exemplified.

Among them, the polymer material having a cyanoethyl group is suitably utilized.

Further, in the viscoelastic matrix 24 of the piezoelectric layer 12, dielectric polymer added in addition to the material having viscoelasticity at room temperature, such as cyanoethylated PVA, is not limited to one kind of polymer, and a plurality of kinds of polymers may be added.

Further, in order to adjust a glass transition point Tg, a thermoplastic resin such as a vinyl chloride resin, polyethylene, polystyrene, a methacrylic resin, polybutene or isobutylene, or a thermosetting resin such as a phenol resin, an urea resins, a melamine resin, an alkyd resin or mica may be added, in addition to the dielectric polymer.

Further, in order to improve adhesiveness, a viscosity imparting agent such as rosin ester, rosin, terpene, terpene phenol, or a petroleum resin may be added.

In the viscoelastic matrix 24 of the piezoelectric layer 12, an addition amount when a polymer other than a material having viscoelasticity at room temperature, such as cyanoethylated PVA, is added is not particularly limited, and a percentage in the viscoelastic matrix 24 is preferably 30% by mass or less.

Thus, it is possible to obtain desirable results, for example, in terms of a high dielectric constant, improved heat resistance, or improved adhesion to the piezoelectric particles 26 or the electrode layer since characteristics of the polymer material to be added can be expressed without impairing a viscoelasticity relaxation mechanism in the viscoelastic matrix 24.

In the piezoelectric layer 12, the piezoelectric particles 26 are dispersed in the viscoelastic matrix 24.

For the piezoelectric particles 26, various particles formed of a known piezoelectric body are available, but particles formed of ceramic particles having a perovskite or wurtzite crystal structure are preferably exemplified.

As the ceramic particles constituting the piezoelectric particles 26, specifically, lead zirconate titanate (PZT), lanthanum zirconate titanate lead (PLZT), barium titanate (BaTiO$_3$), zinc oxide (ZnO), and a solid solution (BFBT) of barium and bismuth ferrite titanate (BiFe$_3$) are preferably exemplified.

A particle size of the piezoelectric particles 26 may be appropriately selected according to a size or a use of the conversion film 10. According to the study of the present inventors, the particle size of the piezoelectric particles 26 is preferably 1 to 10 µm.

When the particle size of the piezoelectric particles 26 is in the above range, it is possible to obtain preferable results, for example, in that both of high piezoelectric characteristics and flexibility can be achieved.

In FIG. 1B, the piezoelectric particles 26 in the piezoelectric layer 12 are distributed with regularity in the viscoelastic matrix 24, but the present invention is not limited thereto.

That is, although the piezoelectric particles 26 in the piezoelectric layer 12 are preferably homogeneously dispersed, the piezoelectric particles 26 may be randomly dispersed in the viscoelastic matrix 24.

In the conversion film 10 of the present invention, an amount ratio of the viscoelastic matrix 24 and the piezoelectric particles 26 in the piezoelectric layer 12 may be appropriately set according to a size or a thickness of the conversion film 10, a use of the conversion film 10, characteristics required for the conversion film 10, or the like. The size of the conversion film 10 is a size in a surface direction of the conversion film.

Here, according to study of the present inventors, a volume fraction of the piezoelectric particles 26 in the piezoelectric layer 12 is preferably 30% to 70%, particularly preferably 50% or more, and therefore, more preferably 50% to 70%.

When the amount ratio between the viscoelastic matrix 24 and the piezoelectric particles 26 is in the above range, it is possible to obtain preferable results, for example, in that both of high piezoelectric characteristics and flexibility can be achieved.

Further, in the conversion film 10 of the present invention, the thickness of the piezoelectric layer 12 is not particularly limited and may be appropriately set according to a size of the conversion film 10, use of the conversion film 10, characteristics required for the conversion film 10, or the like.

Here, according to the study of the present inventors, the thickness of the piezoelectric layer 12 is preferably 10 µm to 300 µm, more preferably 20 to 200 µm, and particularly preferably 30 to 100 µm.

When the thickness of the piezoelectric layer 12 is in the above range, it is possible to obtain preferable results, for example, in that both of ensuring of rigidity and appropriate flexibility can be achieved.

The piezoelectric layer 12 is preferably subjected to a polarization process (polling) as described above. The polarization process will be described in detail below.

Figure 2A:
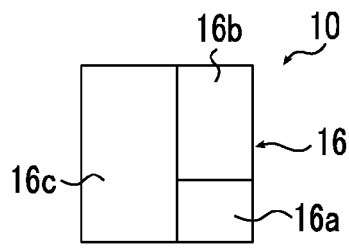
FIGS. 2A to 2H are conceptual diagrams illustrating an operation of the electro-acoustic conversion film illustrated in FIGS. 1A and 1B.

As illustrated in FIG. 2A, in the conversion film 10 of the present invention, the lower thin-film electrode 14 is formed on one surface of the piezoelectric layer 12, and the upper thin-film electrode 16 is formed on the other surface of the piezoelectric layer 12. Further, the lower protective layer 18 is formed on the lower thin-film electrode 14, and the upper protective layer 20 is formed on the upper thin-film electrode 16.

That is, the conversion film 10 has a configuration in which piezoelectric layer 12 is sandwiched between the lower thin-film electrode 14 and the upper thin-film electrode 16, and this laminated body is sandwiched between the lower protective layer 18 and the upper protective layer 20.

Here, the upper electrode 16 is divided into three regions including first segment 16a, the second segment 16b, and the third segment 16c. On the other hand, the lower electrode 14 serves as an electrode common to all the segments of the upper electrode 16. Accordingly, driving power is individually supplied to the first segment 16a, the second segment 16b, and the third segment 16c to individually drive the piezoelectric layer 12 in the corresponding regions. Thus, sound can be output.

An area of each segment of the upper electrode 16 increases 2n times to correspond to each bit digit of a parallel PCM digital signal. Thus, the conversion film 10 can output D/A-converted reproduction sound according to the supplied parallel PCM digital signal.

Further, the piezoelectric layer 12 is a layer in which the piezoelectric particles 26 are dispersed in the viscoelastic matrix 24 formed of a polymer material having viscoelasticity at room temperature. Therefore, even when each segment of the upper electrode 16 is pulse-driven, reverberation is less and crosstalk in which vibrations of the respective segments interfere with each other is less. This will be described in detail below.

In the conversion film 10 of the illustrated example, the lower electrode 14 is an electrode common to all the three segments. However, in the conversion film of the present invention, the lower electrode 14 may also be divided to correspond to each segment of the upper electrode 16. Alternatively, the lower electrode 14 may be divided into an electrode common to the two segments of the upper electrode and an electrode corresponding to the one segment.

Further, planar shapes of the upper electrode and the lower electrode may be different. For example, the upper electrode is circular and the lower electrode is rectangular.

The same applies to each conversion film illustrated in, for example, FIG. 5A, 6A, 7A and the like to be described below.

In the conversion film 10, the lower protective layer 18 and the upper protective layer 20 impart appropriate rigidity and mechanical strength to the piezoelectric layer 12.

In the conversion film 10 of the present invention, the piezoelectric layer 12 formed of the viscoelastic matrix 24 and the piezoelectric particles 26 shows very excellent flexibility with respect to slow bending deformation. On the other hand, the piezoelectric layer 12 may have insufficient rigidity and mechanical strength in some applications. In the conversion film 10, the lower protective layer 18 and the upper protective layer 20 are provided as a preferred aspect in order to compensate for synthesis or mechanical strength.

The lower protective layer 18 and the upper protective layer 20 are not particularly limited, and various sheet-like objects are available.

For example, various resin films (plastic films) are preferably exemplified. Particularly, polyethylene terephthalate (PET), polypropylene (PP), polystyrene (PS), polycarbonate (PC), polyphenylene sulfide (PPS), polymethyl methacrylate (PMMA), polyetherimide (PEI), polyimide (PI), polyethylene naphthalate (PEN), triacetyl cellulose (TAC), or a cyclic olefin resin is preferably used because of, for example, excellent mechanical properties and heat resistance thereof.

Thicknesses of the lower protective layer 18 and the upper protective layer 20 are not particularly limited. Further, although the thicknesses of the lower protective layer 18 and the upper protective layer 20 are basically the same, the thicknesses may be different.

Here, if the rigidity of the lower protective layer 18 and the upper protective layer 20 is too high, expansion and contraction of the piezoelectric layer 12 are restrained and flexibility is also impaired. Accordingly, the lower protective layer 18 and the upper protective layer 20 are advantageously thinner except that mechanical strength or good handlability of a sheet-like object is required.

According to the study of the present inventors, if the thicknesses of the lower protective layer 18 and the upper protective layer 20 are equal to or smaller than twice the thickness of the piezoelectric layer 12, it is possible to obtain preferable results, for example in that both of ensuring of rigidity and appropriate flexibility are achieved.

For example, if the thickness of the piezoelectric layer 12 is 50 µm and the lower protective layer 18 and the upper protective layer 20 are formed of PET, the thicknesses of the lower protective layer 18 and the upper protective layer 20 are preferably 100 µm or less, more preferably 50 µm or less, and particularly preferably, 25 µm or less.

In the conversion film 10 of the present invention, the lower thin-film electrode 14 is formed between the piezoelectric layer 12 and the lower protective layer 18, and the upper thin-film electrode 16 is formed between the piezoelectric layer 12 and the upper protective layer 20. In the following description, the lower thin-film electrode 14 is also referred to as the lower electrode 14. In the following description, the upper thin-film electrode 16 is also referred to as the upper electrode 16.

The lower electrode 14 and the upper electrode 16 are provided in order to apply an electric field to the piezoelectric layer 12 to expand and contract the piezoelectric layer 12 in a region corresponding to each segment of the upper electrode 16 and output sound.

In the present invention, a material for forming the lower electrode 14 and the upper electrode 16 is not particularly limited, and various conductors are available. Specifically, carbon, palladium, iron, tin, aluminum, nickel, platinum, gold, silver, copper, chromium, molybdenum, an alloy thereof, indium tin oxide, or the like is exemplified. Among them, any one of the copper, the aluminum, the gold, the silver, the platinum, and the indium tin oxide is preferably exemplified.

Further, a method of forming the lower electrode 14 and the upper electrode 16 is not particularly limited, and various known methods such as a vapor deposition method (a vacuum film formation method) such as vacuum deposition or sputtering, film formation using plating, or a method of adhering a foil formed of the above material are available.

In particular, a thin film of copper or aluminum formed by vacuum evaporation is preferably used as the lower electrode 14 and the upper electrode 16, for example, since the flexibility of the conversion film 10 can be ensured. Particularly, the thin film of copper formed by the vacuum deposition is preferably used.

Thicknesses of the lower electrode 14 and the upper electrode 16 are not particularly limited. Although the thicknesses of the lower electrode 14 and the upper electrode 16 are basically equal, the thicknesses may be different.

Here, if the rigidity of the lower electrode 14 and the upper electrode 16 is too high, expansion and contraction of the piezoelectric layer 12 are restrained and flexibility is also impaired, similar to the lower protective layer 18 and the upper protective layer 20 described above. Accordingly, the lower electrode 14 and the upper electrode 16 are advantageously thinner as long as electrical resistance is not too high.

Here, according to the study of the present inventor, it is preferable that a product of the thickness of the lower electrode 14 and the upper electrode 16 and a Young's modulus is smaller than a product of the thickness of the lower protective layer 18 and the upper protective layer 20 and a Young's modulus, since flexibility is not greatly impaired.

For example, when the lower protective layer 18 and the upper protective layer 20 are PET (Young's modulus: about 6.2 GPa) and the lower electrode 14 and the upper electrode 16 are copper (Young's modulus: 130 GPa), if the thickness of the lower protective layer 18 and the upper protective layer 20 is 25 µm, the thickness of the lower electrode 14 and the upper electrode 16 is preferably 1.2 µm or less, more preferably 0.3 µm or less, and particularly preferably 0.1 µm or less.

As described above, the conversion film 10 of the present invention has a configuration in which the piezoelectric layer 12 (polymer composite piezoelectric body) formed by dispersing the piezoelectric particles 26 in the viscoelastic matrix 24 having viscoelasticity at room temperature is sandwiched by the lower electrode 14 and the upper electrode 16, and such a laminated body is sandwiched between the lower protective layer 18 and the upper protective layer 20.

In such a conversion film 10, it is preferable for a maximum value at which a loss tangent (Tan δ) at a frequency of 1 Hz from dynamic viscoelasticity measurement is equal to or greater than 0.1 to be present at room temperature.

Thus, since strain energy can be efficiently diffused as heat to the outside even when the conversion film 10 is subjected to large bending deformation that is relatively slow at several Hz or less from the outside, it is possible to prevent cracks from occurring at an interface between the polymer matrix and the piezoelectric particles.

A storage elastic modulus (E') of the conversion film 10 at a frequency of 1 Hz from dynamic viscoelasticity measurement is preferably 10 to 30 GPa at 0° C. and 1 to 10 GPa at 50° C.

Thus, the conversion film 10 can have large frequency distribution in the storage elastic modulus (E') at room temperature. That is, the conversion film 10 can have hard behave with vibration of 20 Hz to 20 kHz and soft behavior with vibration of a few Hz or less.

Further, in the conversion film 10, it is preferable for a product of the thickness and a storage elastic modulus (E') at a frequency of 1 Hz from dynamic viscoelasticity measurement to be $1.0 \times 10^6$ to $2.0 \times 10^6$ (1.0E+06 to 2.0E+06) N/m at 0° C., and $1.0 \times 10^5$ to $1.0 \times 10^6$ (1.0E+05 to 1.0E+06) N/m at 50° C.

Thus, appropriate rigidity and mechanical strength are included in a range in which the conversion film 10 does not impair the flexibility and acoustical properties.

Further, in the conversion film 10, it is preferable for a loss tangent (Tan δ) at 25° C. and a frequency of 1 kHz to be 0.05 or more in a master curve obtained from dynamic viscoelasticity measurement.

Thus, a frequency characteristic of a speaker using the conversion film 10 becomes smooth, and an amount of change in sound quality when a lowest resonance frequency $f_0$ due to a change in curvature of the speaker is changed can be small.

As illustrated in FIG. 1A, the upper electrode 16 is divided into three segments including the first segment 16a, the second segment 16b, and the third segment 16c.

In the upper electrode 16, the respective segments are separated with a gap 16s not to be electrically connected to each other. The gap 16s between the respective segments, that is, a separation distance between the respective segments is preferably 1 mm or more, and more preferably, 10 mm or more. The gap 16s between the respective segments is preferably 1 mm or more in that crosstalk between the segments can be prevented more suitably.

Further, an insulating layer may be provided between the respective segments, if necessary.

Here, an area of each segment of the upper electrode 16 increases by $2^n$ times to correspond to each bit digit of the parallel PCM digital signal. "$2^n$ times" is "n power of 2 times." Further, in this expression, n is a natural number increasing by 1 and including zero.

The number of segments is the maximum bit number N. Thus, a largest segment is a segment of which the area increases to $2^{N-1}$ times with respect to a segment having a minimum area according to the maximum bit number N of the conversion film. In other words, the largest segment is a segment weighted to $2^{N-1}$ times with respect to the segment having a minimum area according to the maximum bit number N of the conversion film.

In the conversion film 10 of the illustrated example, the upper electrode 16 is divided into segments to have an area that is proportional to a weight of each bit digit of a parallel PCM digital signal of 3 bit digits to correspond to an output of 3 bits ((8 gradations) audio output intensity of 8 steps). That is, if the area of the first segment 16a is 1 ($2^0$), the area of the second segment 16b is 2($2^1$), and the area of the third segment 16c is 4 ($2^2$).

Accordingly, sound waves generated from the respective segments are added and combined in proportion to a weight of each bit digit by driving the first segment 16a to the third segment 16c of the upper electrode 16 in eight driving patterns in which the segment corresponding to each bit digit is indicated by a binary representation of 3 bits according to the 3-bit parallel PCM digital signal, and reproduction sound with eight gradations correctly subjected to the D/A conversion can be output.

FIGS. 2A to 2H schematically illustrate an example of the method of driving the conversion film 10 according to the parallel PCM digital signal.

In FIGS. 2A to 2H, the upper protective layer 20 is omitted in order to clearly illustrate a configuration, and the gap between the segments is also omitted in order to simplify FIGS. 2A to 2H.

Further, in FIGS. 2A to 2H, segments to be driven are shaded.

In a case where the parallel PCM digital signal is "0", any of the first segment 16a to the third segment 16c are not driven (0+0+0=0), as illustrated in FIG. 2A.

Figure 2E:
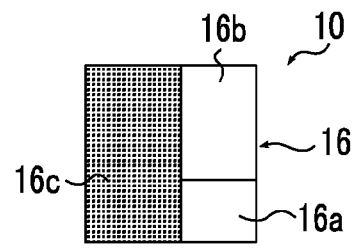
Figure 2B:
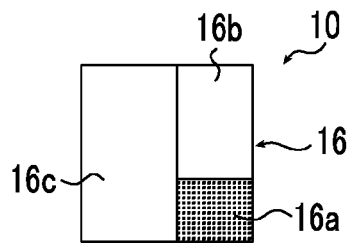

In a case where the parallel PCM digital signal is "1", only the first segment 16a is driven ($0+0+2^0=1$), as illustrated in FIG. 2B.

Figure 2F:
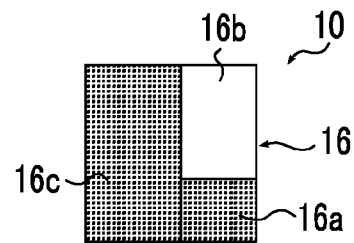
Figure 2C:
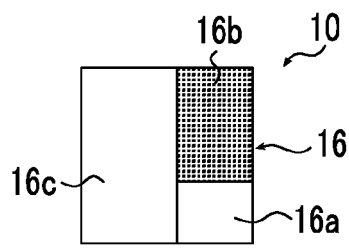

In a case where the parallel PCM digital signal is "2", only the second segment 16b is driven ($0+2^1+0=2$), as illustrated in FIG. 2C.

Figure 2G:
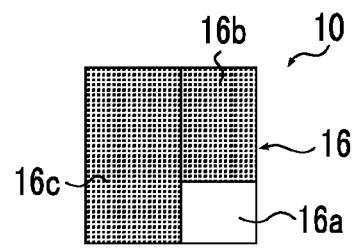
Figure 2D:
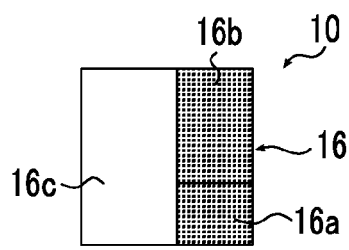

In a case where the parallel PCM digital signal is "3", the first segment 16a and the second segment 16b are driven ($0+2^1+2^0=3$), as illustrated in FIG. 2D.

In a case where the parallel PCM digital signal is "4", only the third segment 16c is driven ($2^2+0+0=4$), as illustrated in FIG. 2E.

In a case where the parallel PCM digital signal is "5", the first segment 16a and the third segment 16c are driven ($2^2+0+2^0=5$), as illustrated in FIG. 2F.

In a case where the parallel PCM digital signal is "6", the second segment 16b and the third segment 16c are driven ($2^2+2^1+0=6$), as illustrated in FIG. 2G.

Figure 2H:
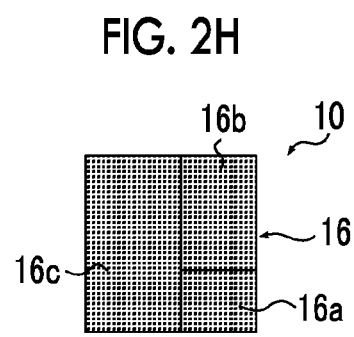

Further, in a case where the parallel PCM digital signal is "7", the first segment 16a to the third segment 16c are all driven ($2^2+2^1+2^0=7$), as illustrated in FIG. 2H.

Thus, audio output subjected to D/A conversion with intensity of 8 gradations including 0 to 7 gradations according to the 3-bit parallel PCM digital signal can be performed.

Here, as described above, in the conversion film 10 of the present invention, the polymer composite piezoelectric body in which the piezoelectric particles 26 are dispersed in the viscoelastic matrix 24 formed of a polymer material having viscoelasticity at room temperature is used as the piezoelectric layer 12.

As described above, this conversion film 10 has large frequency distribution in the elastic modulus, and has hard behave with vibration in an audio band (100 Hz to 10 kHz) at room temperature and soft behavior with vibration of a few Hz or less. Further, this conversion film 10 has an appropriately great loss tangent with respect to the vibration at all of the frequencies of 20 kHz or less at room temperature, and the loss tangent in an audio band is as very great as 0.09 to 0.35.

Therefore, a digital speaker using the conversion film 10 as a vibration plate can perform high-quality reproduction in a wide frequency band, and even when a parallel PCM digital signal is reproduced, interference of vibration between the respective segments is very small.

Further, the conversion film 10 immediately increases audio output according to ON of the parallel PCM digital signal and immediately stops the audio output according to OFF. That is, in the conversion film 10, reverberation is very small.

Therefore, according to the conversion film 10 (digital speaker) of the present invention, the parallel PCM digital signal can be suitably reproduced in each segment.

Further, according to the electro-acoustic conversion film of the present invention, a flexible digital speaker can be achieved and even when the electro-acoustic conversion film is bent, a change in sound quality due to a curvature or a direction of bending is small.

Figure 3A:
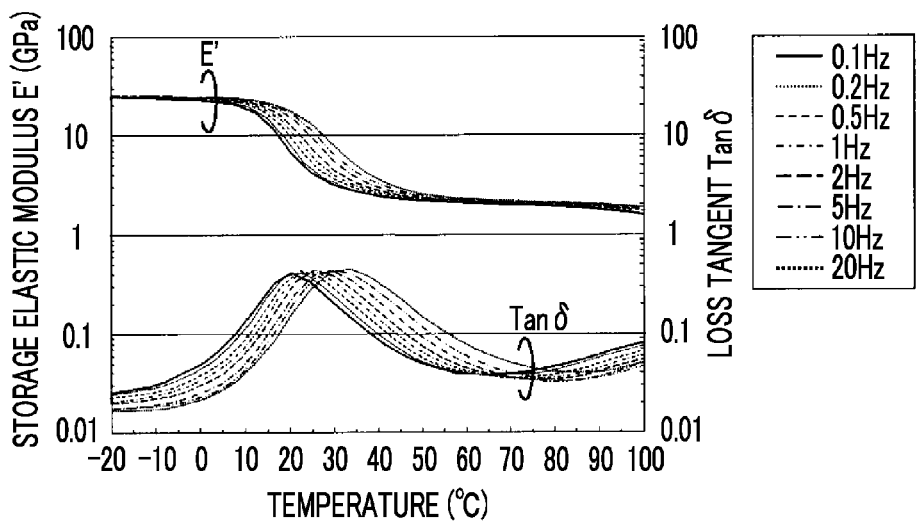
FIG. 3A is a graph illustrating dynamic viscoelasticity of the electro-acoustic conversion film illustrated in FIGS. 1A and 1B.

In FIG. 3A, a result of measuring temperature dependency of dynamic viscoelasticity after a test piece of the conversion film 10 is produced is illustrated. Further, in FIG. 3B, a master curve at a reference temperature of 25° C. obtained from such a dynamic viscoelasticity measurement is illustrated.

The master curve shows frequency distribution of a viscoelastic property at a certain temperature. In general, there is a certain relationship based on a "time-temperature conversion rule" between a frequency and a temperature in a dynamic viscoelasticity measurement result. For example, a change in temperature can be converted into the change in frequency, and the frequency distribution of the viscoelastic property at a certain temperature can be examined. A curve created at that time is referred to as a master curve. Since viscoelasticity measurement in an actual audio band such as 1 kHz is not realistic, the master curve is effective in understanding a storage elastic modulus E' or a loss tangent Tan δ of a material in the audio band.

Figure 3B:
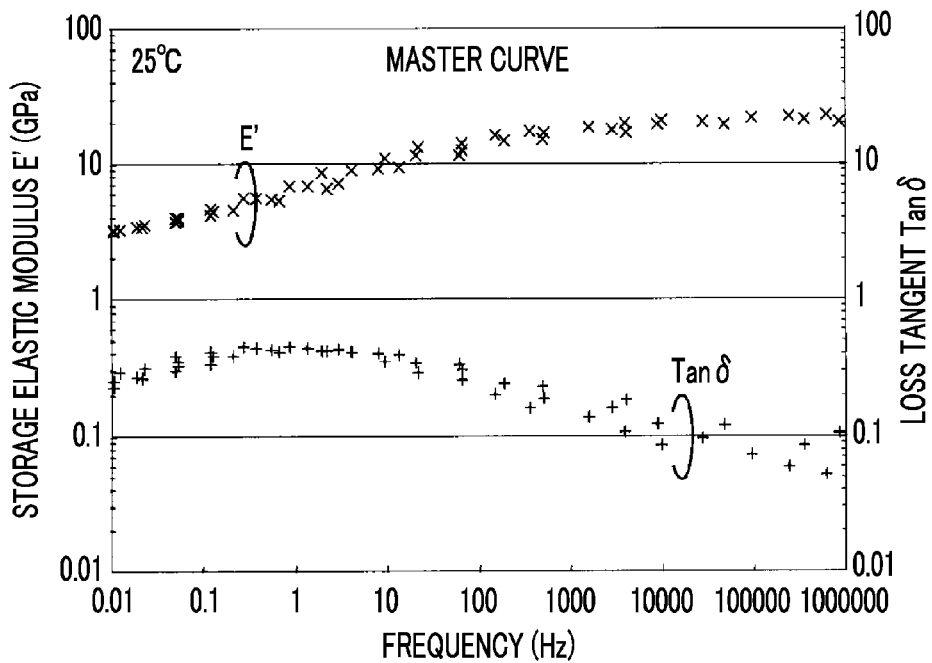
FIG. 3B is a master curve of the electro-acoustic conversion film illustrated in FIGS. 1A and 1B.

The graphs illustrated in FIGS. 3A and 3B are measured by performing the following test using the test piece of the conversion film produced using a method described in an embodiment to be described below.

[Dynamic Viscoelasticity Test]

A strip-shaped test piece of 1 cm×4 cm was prepared from a prepared conversion film.

The dynamic viscoelasticity (storage elastic modulus E'(GPa) and the loss tangent Tan δ) of the test piece was measured using a dynamic viscoelasticity tester (SII Nanotechnology DMS6100 viscoelasticity spectrometer). Measurement conditions were as follows.

Measurement temperature range: −20° C. to 100° C.
Rate of temperature rise: 2° C./minute
Measurement frequency: 0.1 Hz, 0.2 Hz, 0.5 Hz, 1.0 Hz, 2.0 Hz, 5.0 Hz, 10 Hz, and 20 Hz
Measurement mode: tension measurement The conversion film 10 of the present invention has a region to which no signal is applied between the segments. The region to which no the signal is applied between the segments is the gap 16s and is a division region that divides the respective segments.

This division region always exhibits rheological properties at a frequency of 0 Hz. Here, as illustrated in FIG. 3B, in the conversion film 10, when a frequency is approximately 0 Hz, the loss tangent (loss tangent Tan δ) is great and a storage elastic modulus E' is small. Accordingly, sound velocity is low. Therefore, it is possible to cancel vibrations from the respective segments in this separation region and to prevent the vibration of one segment from propagating to the other segment. Therefore, even when different signals are input to the respective segments and reproduced, it is possible to suitably reproduce an acoustic signal in the respective regions without vibrations of the respective segments interfering with each other.

Further, the vibration starts immediately according to application of a voltage and, when driving stops, the vibration immediately stops. That is, the reverberation is less.

Hereinafter, an example of a method of manufacturing the conversion film 10 will be described with reference to conceptual diagrams of FIGS. 4A to 4E.

Figure 4A:
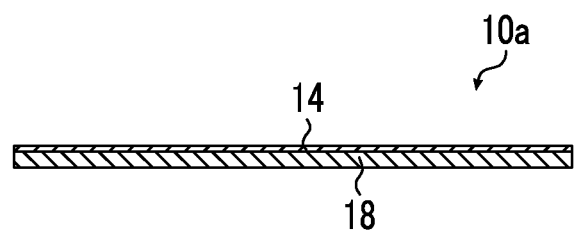
FIGS. 4A to 4E are conceptual diagrams illustrating an example of a method of manufacturing the electro-acoustic conversion film illustrated in FIGS. 1A and 1B.

First, as illustrated in FIG. 4A, a sheet-like object 10a in which the lower electrode 14 is formed on the lower protective layer 18 is prepared.

This sheet-like object 10a may be produced by forming a copper thin film or the like serving as the lower electrode 14 on a surface of the lower protective layer 18 using vacuum deposition, sputtering, plating, or the like. Alternatively, a commercially available product in which a copper thin film or the like is formed on the lower protective layer 18 may be used as the sheet-like object 10a.

On the other hand, a polymer material having viscoelasticity at room temperature, such as cyanoethylated PVA, is dissolved in an organic solvent, piezoelectric particles 26 such as PZT particles are added, and a coating material obtained by stirring and dispersing is prepared. In the following description, a polymer material having viscoelasticity at room temperature is also referred to as a viscoelastic material.

The organic solvent is not particularly limited, and various organic solvents such as dimethylformamide (DMF), methyl ethyl ketone, and cyclohexanone are available.

Figure 4B:
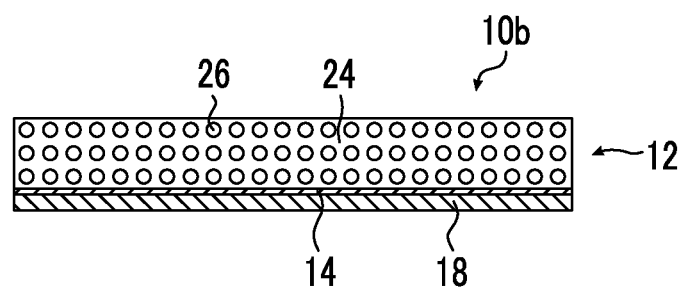

After the sheet-like object 10a is prepared and the above-described coating material is prepared, the coating material is cast (coated) to the sheet-like object 10a, the organic solvent is evaporated, and drying is performed. Thus, as illustrated in FIG. 4B, the lower electrode 14 is included on the lower protective layer 18, and the piezoelectric layer 12 is formed on the lower electrode 14 to prepare a laminated body 10b.

A method of casting the coating material is not particularly limited, and known methods (coating devices) such as a slide coater and a doctor knife are all available.

Alternatively, if the viscoelastic material is a thermally meltable material such as cyanoethylated PVA, the following method is available. First, a molten material is prepared by heating and melting a viscoelastic material and adding/dispersing the piezoelectric particles 26 to the viscoelastic material. The molten material is extruded in a sheet shape on the sheet-like object illustrated in FIG. 4A using extrusion molding or the like and is cooled. Thus, a laminated body 10b formed by forming the lower electrode 14 on the lower protective layer 18 and forming the piezoelectric layer 12 on the lower electrode 14 may be prepared, as illustrated in FIG. 4B.

In the conversion film 10 of the present invention, a polymer piezoelectric material such as PVDF may be added to the viscoelastic matrix 24, in addition to the viscoelastic material, such as the cyanoethylated PVA, as described above.

When the polymer piezoelectric material is added to the viscoelastic matrix 24, the polymer piezoelectric material to be added to the above-described coating material may be dissolved. Alternatively, the polymer piezoelectric material to be added may be added to the above-described heated and melted viscoelastic material and may be heated and melted.

After the laminated body 10b in which the lower electrode 14 is included on the lower protective layer 18 and the piezoelectric layer 12 is formed on the lower electrode 14 is produced, the polarization process (polling) is preferably performed on the piezoelectric layer 12.

A method of polarization-processing the piezoelectric layer 12 is not particularly limited, and a known method is available. A method illustrated in FIGS. 4C and 4D is exemplified as a preferable polarization process method.

Figure 4C:
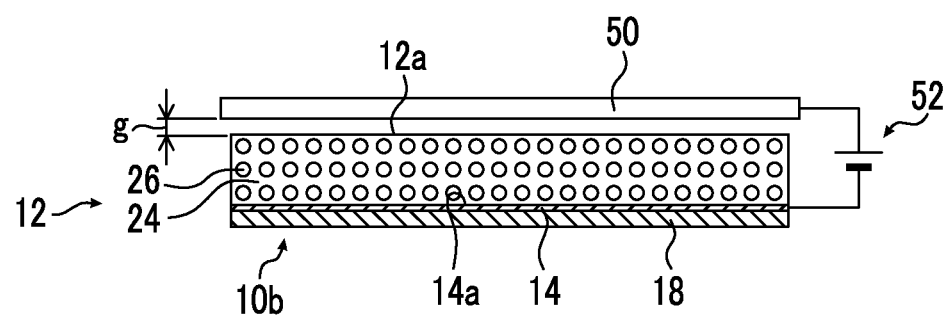
Figure 4D:
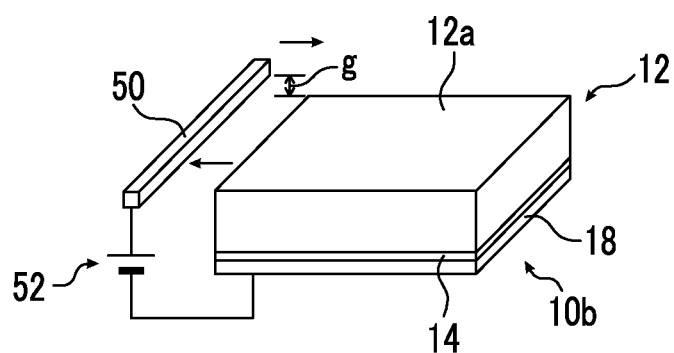

In this method, as illustrated in FIGS. 4C and 4D, a gap g of, for example, 1 mm is formed on an upper surface 12a of the piezoelectric layer 12 of the laminated body 10b, and a movable rod-like or wire-like corona electrode 50 is provided along the upper surface 12a. The corona electrode 50 and the lower electrode 14 are connected to a DC power supply 52.

Further, heating means for heating and holding the laminated body 10b, such as a hot plate, is prepared.

A DC voltage of a few kV, for example, 6 kV is applied between the lower electrode 14 and the corona electrode 50 from the DC power supply 52 in a state in which the piezoelectric layer 12 is heated and held on the laminated body 10b, for example, at a temperature of 100° C. by the heating means, causing corona discharge. Further, the corona electrode 50 is moved (scanned) along the upper surface 12a of the piezoelectric layer 12 in a state in which the gap g is maintained, and a polarization process of the piezoelectric layer 12 is performed.

In the polarization process using such corona discharge, known means of moving a rod-like object may be used for movement of the corona electrode 50. In the following description, the polarization process using the corona discharge is also referred to as a corona polling process.

Further, in the corona polling process, a method of moving the corona electrode 50 is not limited. That is, the corona electrode 50 may be fixed, moving mechanism that moves the laminated body 10b may be provided, and the laminated body 10b may be moved so as to perform the polarization process. For movement of the laminated body 10b, known means for moving a sheet-like object may be used.

Further, the number of corona electrodes 50 is not limited to 1, and the corona polling process may be performed using a plurality of corona electrodes 50.

Further, the polarization process is not limited to the corona polling process, and normal electric field polling in which a DC electric field is directly applied to a polarization process target is also available. However, when the normal electric field polling is performed, it is necessary for the upper electrode 16 to be formed prior to the polarization process.

Calendar processing of smoothing a surface of the piezoelectric layer 12 using a heating roller or the like may be performed prior to this polarization process. By applying the calendar processing, a thermal pressure bonding process to be described below can be performed smoothly.

On the other hand, a sheet-like object 10c in which the upper electrode 16 of the upper protective layer 20 is formed is prepared.

In the sheet-like object 10c, the upper electrode 16 divided into the respective segments may be produced by forming a copper thin film or the like using vacuum deposition or the like similarly to the above-described sheet-like object 10a, for example, by performing masking or the like on the surface of the upper protective layer 20. Alternatively, the upper electrode 16 divided into the respective segments may be produced by processing the above-described sheet-like object 10a according to a material for forming the upper electrode 16. Alternatively, the upper electrode 16 divided into the respective segments may be produced by forming a silver paste or the like on the surface of the piezoelectric layer 12 using screen printing.

Figure 4E:
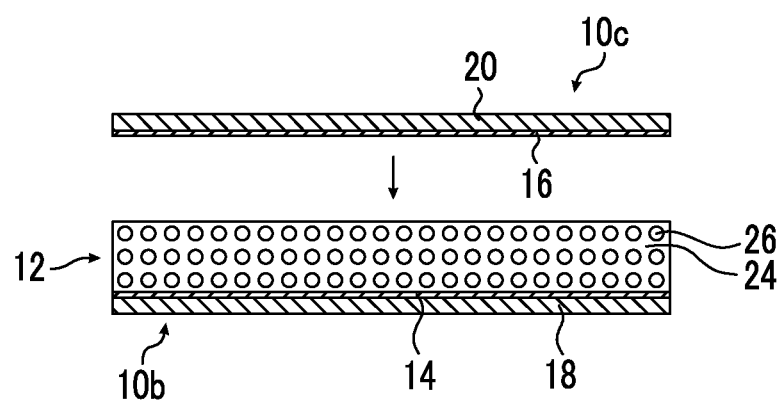

This sheet-like object 10c is laminated to the laminated body 10b subjected to the polarization process of the piezoelectric layer 12, with the upper electrode 16 directed to the piezoelectric layer 12, as illustrated in FIG. 4E.

Further, a laminated body of the laminated body 10b and the sheet-like object 10c is sandwiched between the lower protective layer 18 and the upper protective layer 20, and subjected to thermocompression bonding using a hot press apparatus, a heating roller, or the like to complete the conversion film 10 of the present invention as illustrated in FIGS. 1A and 1B.

The conversion film 10 illustrated in FIGS. 1A and 1B is obtained by dividing the upper electrode 16 of the conversion film 10 having a rectangular planar shape into rectangular segments.

In addition thereto, various configurations are available in the conversion film of the present invention.

FIGS. 5A to 5H conceptually illustrate another example of the conversion film of the present invention. FIGS. 5A to 5H are top views, similar to FIG. 1B and FIGS. 2A to 2H.

In FIGS. 5A to 5H, an upper protective layer 20 is omitted in order to clearly illustrate a configuration, and a gap between respective segments is also omitted in order to simplify FIGS. 5A to 5H.

Figure 5A:
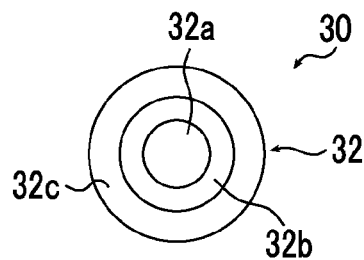
FIGS. 5A to 5H are conceptual diagrams illustrating another example of the electro-acoustic conversion film of the present invention, and an operation thereof.

Further, a conversion film 30 illustrated in FIG. 5A or the like is the same as the conversion film 10 illustrated in FIGS. 1A and 1B in that a configuration in which a piezoelectric layer 12 is sandwiched between a lower electrode 14 and an upper electrode 32, and such a laminated body is sandwiched between a lower protective layer 18 and an upper protective layer 20 is adopted. Further, the lower electrode 14 is a common electrode that is common to respective divided segments of the upper electrode 32.

The same applies to the conversion film illustrated in FIG. 6A, FIG. 7A, or the like to be described below.

The conversion film 30 is not limited to a conversion film having a circular planar shape, and a circular upper electrode 32 may be formed in a conversion film having a rectangular plane shape. Alternatively, conversely, a rectangular upper electrode may be formed in a circular conversion film.

The same applies to a conversion film illustrated in FIG. 6A, FIG. 7A, or the like to be described below.

In the conversion film 30 illustrated in FIG. 5A or the like, the upper electrode 32 is divided into three segments including a first circular segment 32a, a second annular segment 32b surrounding the first segment 32a, and a third annular segment 32c surrounding the second segment 32b. The first segment 32a, the second segment 32b, and the third segment 32c are concentric.

In other words, the annular shape is a shape formed of two concentric circles having different radii on a plane.

In the conversion film 30, each segment of the upper electrode 32 has an area proportional to a weight of each bit digit of a parallel PCM digital signal which has 3 bit digits corresponding to a 3-bit (8 gradations) output. That is, if an area of the first segment 32a is 1, an area of the second segment 32b is 2 and an area of the third segment 32c is 4.

Therefore, reproduction sound with eight gradations correctly subjected to the D/A conversion can be output by driving the segment corresponding to each bit digit with eight driving patterns according to the 3-bit parallel PCM digital signal.

That is, in a case where the parallel PCM digital signal is "0", all of the first segment 32a to the third segment 32c are not driven (0+0+0=0), as illustrated in FIG. 5A.

Figure 5E:
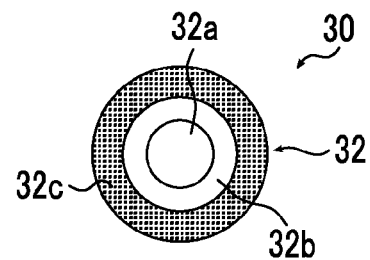
Figure 5B:
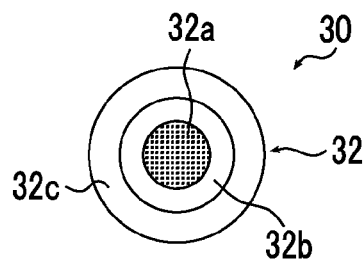

In a case where the parallel PCM digital signal is "1", only the first segment 32a is driven (0+0+$2^0$=1), as illustrated in FIG. 5B.

Figure 5F:
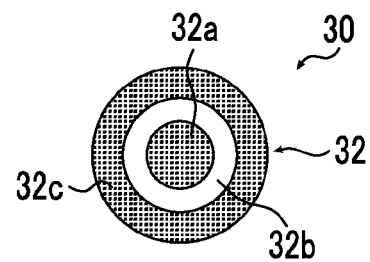
Figure 5C:
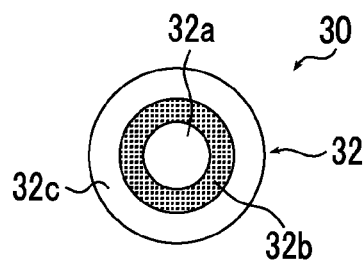

In a case where the parallel PCM digital signal is "2", only the second segment 32b is driven (0+$2^1$+0=2), as illustrated in FIG. 5C.

Figure 5G:
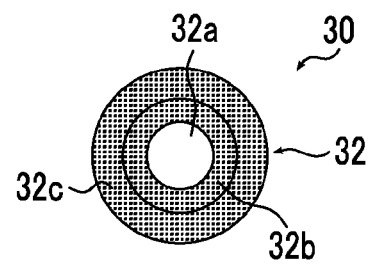
Figure 5D:
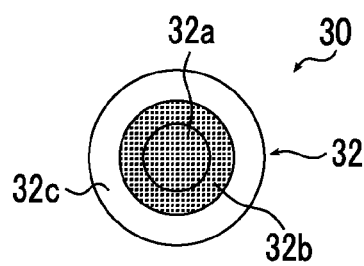

In a case where the parallel PCM digital signal is "3", the first segment 32a and the second segment 32b are driven (0+$2^1$+$2^0$=3), as illustrated in FIG. 5D.

In a case where the parallel PCM digital signal is "4", only the third segment 32c is driven ($2^2$+0+0=4), as illustrated in FIG. 5E.

In a case where the parallel PCM digital signal is "5", the first segment 32a and the third segment 32c are driven ($2^2$+0+$2^0$=5), as illustrated in FIG. 5F.

In a case where the parallel PCM digital signal is "6", the second segment 32b and the third segment 32c are driven ($2^2$+$2^1$+0=6), as illustrated in FIG. 5G.

Figure 5H:
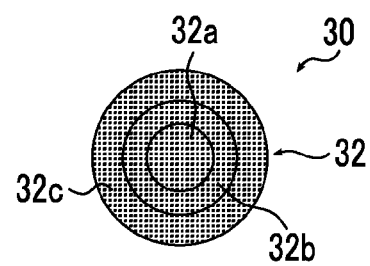

Further, in a case where the parallel PCM digital signal is "7", the first segment 32a to the third segment 32c are all driven ($2^2$+$2^1$+$2^0$=7), as illustrated in FIG. 5H.

Thus, audio output subjected to D/A conversion with intensity of 8 gradations including 0 to 7 gradations according to the 3-bit parallel PCM digital signal can be performed.

In the conversion film 10 illustrated in FIGS. 1A and 1B, sound is likely to be heard unevenly since each segment of the upper electrode 16 is unevenly distributed.

On the other hand, in the conversion film 30 illustrated in FIG. 5A or the like, there is no uneven distribution of sound and more natural sound output can be achieved since the respective segments of the upper electrode 32 are formed in concentric circular and annular shapes.

In the conversion film 30 illustrated in FIG. 5A or the like, there is no circular segment, and the upper electrode may be formed of only annular segments.

FIGS. 6A to 6H conceptually illustrate another example of the conversion film of the present invention. FIGS. 6A to 6H are top views, similar to FIG. 1B or FIGS. 2A to 2H.

Figure 6A:
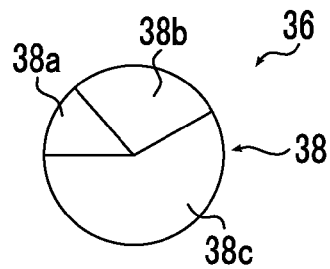
FIGS. 6A to 6H are conceptual diagrams illustrating still another example of the electro-acoustic conversion film of the present invention, and an operation thereof.

In the conversion film 36 illustrated in FIG. 6A or the like, the upper electrode 38 is circular. The upper electrode 38 is radially divided from a center of a circle, and is divided into three fan-shaped segments including a first segment 38a, a second segment 38b, and a third segment 38c.

Further, in the conversion film 36, each segment of the upper electrode 38 has an area proportional to a weight of each bit digit of a parallel PCM digital signal which has 3 bit digits corresponding to a 3-bit (8 gradations) output. That is, if an area of the first segment 38a is 1, an area of the second segment 38b is 2 and an area of the third segment 38c is 4.

Therefore, reproduction sound with eight gradations correctly subjected to the D/A conversion can be output by driving the segment corresponding to each bit digit with eight driving patterns according to the 3-bit parallel PCM digital signal.

That is, when the parallel PCM digital signal is "0", all of the first segment 38a to the third segment 38c are not driven (0+0+0=0), as illustrated in FIG. 6A.

Figure 6E:
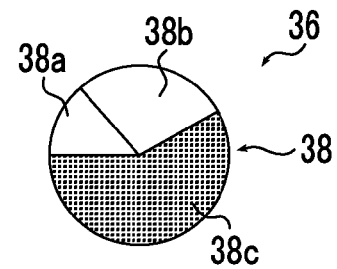
Figure 6B:
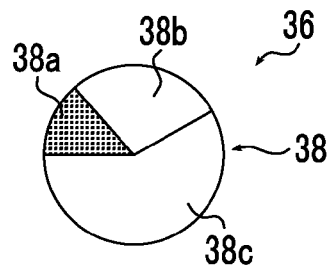

When the parallel PCM digital signal is "1", only the first segment 38a is driven (0+0+$2^0$=1), as illustrated in FIG. 6B.

Figure 6F:
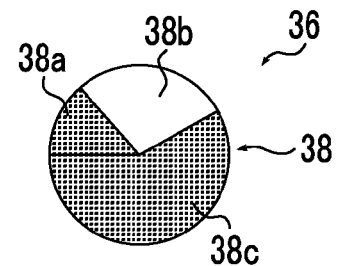
Figure 6C:
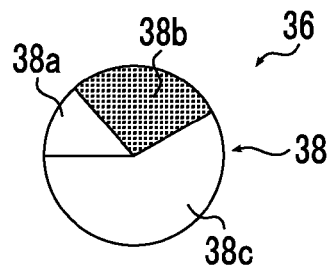

When the parallel PCM digital signal is "2", only the second segment 38b is driven (0+$2^1$+0=2), as illustrated in FIG. 6C.

Figure 6G:
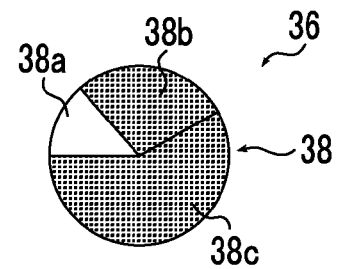
Figure 6D:
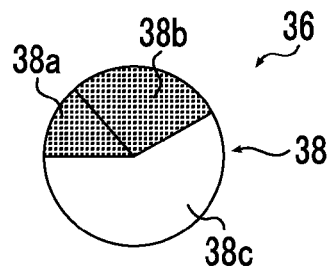

When the parallel PCM digital signal is "3", the first segment 38a and the second segment 38b are driven (0+$2^1$+$2^0$=3), as illustrated in FIG. 6D.

When the parallel PCM digital signal is "4", only the third segment 38c is driven ($2^2$+0+0=4), as illustrated in FIG. 6E.

When the parallel PCM digital signal is "5", the first segment 38a and the third segment 38c are driven ($2^2$+0+$2^0$=5), as illustrated in FIG. 6F.

When the parallel PCM digital signal is "6", the second segment 38b and the third segment 38c are driven ($2^2$+$2^1$+0=6), as illustrated in FIG. 6G.

Figure 6H:
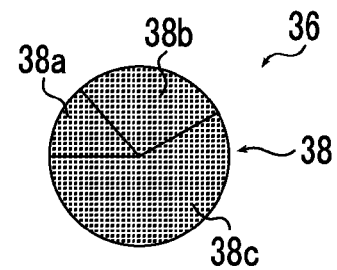

Further, when the parallel PCM digital signal is "7", the first segment 38a to the third segment 38c are driven ($2^2$+$2^1$+$2^0$=7), as illustrated in FIG. 6H.

Thus, audio output subjected to D/A conversion with intensity of 8 gradations including 0 to 7 gradations according to the 3-bit parallel PCM digital signal can be performed.

FIGS. 7A to 7H conceptually illustrate another example of the conversion film of the present invention. FIGS. 7A to 7H are top views, similar to FIG. 1B and FIGS. 2A to 2H.

Figure 7A:
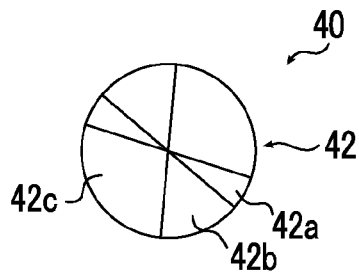
FIGS. 7A to 7H are conceptual diagrams illustrating another example of the electro-acoustic conversion film of the present invention, and an operation thereof.

In the conversion film 40 illustrated in FIG. 7A or the like, an upper electrode 42 is circular. The circular upper electrode 42 is radially divided into fan shapes from a center of the circle. Here, the upper electrode 42 is divided into fan shapes in straight lines passing through the center of the circle, and one segment is formed from two symmetrical regions that are point symmetrical to the center of the circle.

That is, the upper electrode 42 are divided into three segments including a first segment 42a consisting of two symmetrical regions that are point symmetrical to the center, a second segment 42b consisting of two symmetrical regions that are point symmetrical to the center, and a third segment 42c consisting of two symmetrical regions that are point symmetrical to the center.

Further, in the conversion film 40, each segment of the upper electrode 42 has an area proportional to a weight of each bit digit of a parallel PCM digital signal which has 3 bit digits corresponding to a 3-bit (8 gradations) output. That is, if an area of the first segment 42a is 1, an area of the second segment 42b is 2 and an area of the third segment 42c is 4.

Therefore, reproduction sound with eight gradations correctly subjected to the D/A conversion can be output by driving the segment corresponding to each bit digit with eight driving patterns according to the 3-bit parallel PCM digital signal.

That is, when the parallel PCM digital signal is "0", all of the first segment 42a to the third segment 42c are not driven (0+0+0=0), as illustrated in FIG. 7A.

Figure 7E:
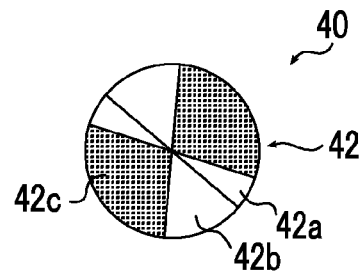
Figure 7B:
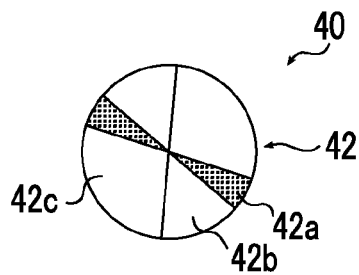

When the parallel PCM digital signal is "1", only the first segment 42a is driven (0+0+$2^0$=1), as illustrated in FIG. 7B.

Figure 7F:
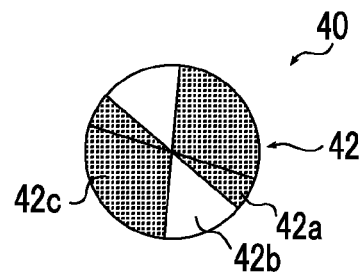
Figure 7C:
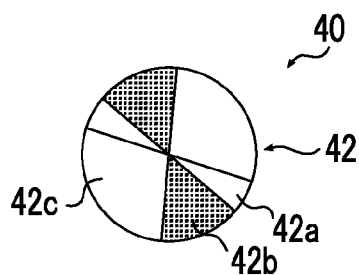

When the parallel PCM digital signal is "2", only the second segment 42b is driven ($0+2^1+0=2$), as illustrated in FIG. 7C.

Figure 7G:
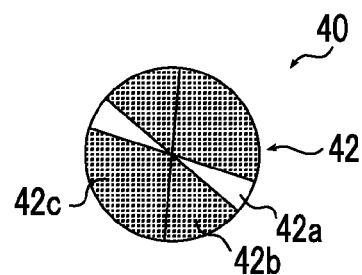
Figure 7D:
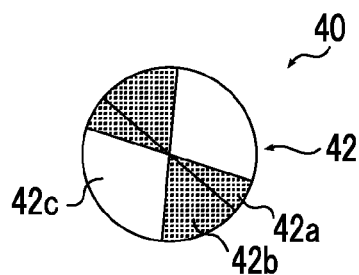

When the parallel PCM digital signal is "3", the first segment 42a and the second segment 42b are driven ($0+2^1+2^0=3$), as illustrated in FIG. 7D.

When the parallel PCM digital signal is "4", only the third segment 42c is driven ($2^2+0+0=4$), as illustrated in FIG. 7E.

When the parallel PCM digital signal is "5", the first segment 42a and the third segment 42c are driven ($2^2+0+2^0=5$), as illustrated in FIG. 7F.

When the parallel PCM digital signal is "6", the second segment 42b and the third segment 42c are driven ($2^2+2^1+0=6$), as illustrated in FIG. 7G.

Figure 7H:
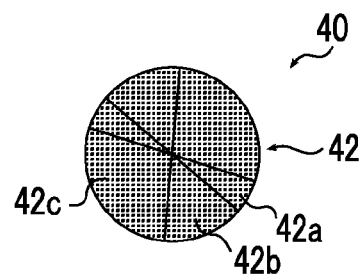

Further, when the parallel PCM digital signal is "7", the first segment 42a to the third segment 42c are driven ($2^2+2^1+2^0=7$), as illustrated in FIG. 7H.

Thus, audio output subjected to D/A conversion with intensity of 8 gradations including 0 to 7 gradations according to the 3-bit parallel PCM digital signal can be performed.

In the conversion film 36 illustrated in FIG. 6A or the like, sound is likely to be heard unevenly since each segment of the upper electrode 38 is unevenly distributed.

On the other hand, in the conversion film 40 illustrated in FIG. 7A or the like, there is no uneven distribution of sound and more natural sound output can be achieved since the respective segments of the upper electrode 42 are formed of two symmetric regions that are point symmetrical to a center.

The conversion film (digital speaker) of the present invention is not limited to the output of the 3-bit 8-gradations as in the illustrated example. That is, if the upper electrode (and/or lower electrode) is divided into N segments corresponding to the maximum bit number N, and the area of each segment is increased by $2^n$ times according to the bit digit, it is possible to cope with an output of various numbers of bits.

For example, in the case of 16 bits, if the upper electrode is divided into 16 segments of which the area increases by $2^n$ times, a parallel PCM digital signal of 16 bit digits can be reproduced. Thus, in this case, the area of the maximum segment is $2^{16-1}$ times the segment having a minimum area. The segment having a minimum area is a segment that represents a parallel PCM digital signal 1.

Further, in the above example, intensities of signals, that is, the driving voltages input to the respective segments are equal and weighting according to each bit digit is performed according to the area of each segment. However, the driving voltages input to the respective segments may be not necessarily equal.

That is, audio output with high gradation can be achieved in the limited number of segments by complementing or extending the weighting based on the area by performing weighting on the driving voltage of each segment.

Although the electro-acoustic conversion film and the digital speaker of the present invention have been described in detail, it is understood that the present invention is not limited to the above-described embodiments and various improvements or modifications may be performed without departing from the scope and spirit of the present invention.

EMBODIMENTS

Hereinafter, the present invention will be described in greater detail using specific embodiments of the present invention.

Embodiment 1

The conversion film 10 of the present invention illustrated in FIGS. 1A and 1B was prepared using the method illustrated in FIGS. 4A to 4E described above.

First, cyanoethylated PVA (CR-V manufactured by Shin-Etsu Chemical Co., Ltd.) was dissolved in dimethyl formamide (DMF) in a compositional ratio described below. Then, the PZT particles was added to this solution in the compositional ratio described below, dispersed by a propeller mixer (number of revolutions: 2000 rpm), and a coating material for forming the piezoelectric layer 12 was prepared.

| | |
|---|---|
| PZT particles | 300 parts by weight |
| Cyanoethylated PVA | 30 parts by weight |
| DMF | 70 parts by weight |

PZT particles obtained by sintering a commercially available PZT raw material powder at 1000° C. to 1200° C. and then crushing and classifying the powder so that an average particle size is 5 μm was used.

On the other hand, the sheet-like objects 10a and 10c obtained by vacuum-depositing a thin copper film having a thickness of 0.1 μm on a PET film having a thickness of 4 μm was prepared. That is, in this example, the lower electrode 14 and the upper electrode 16 were copper deposition thin films having a thickness of 0.1 m, and the lower protective layer 18 and the upper protective layer 20 were PET films having a thickness of 4 μm.

A size of the sheet-like object 10a and the sheet-like object 10c is a size such that a size of a vibration surface when incorporated into a speaker is 210×300 mm (A4 size).

The sheet-like object 10c was used to form the upper electrode 16 divided into the first segment 16a, the second segment 16b, and the third segment 16c as illustrated in FIG. 1A using a mask deposition method.

The gap 16s between the respective segments was 5 mm. Further, in the case of an area of the respective segments, the area of the second segment 16b was twice the area of the first segment 16a, and the area of the third segment 16c was the area of four times the first segment 16a.

The lower electrode 14 (copper deposition thin film) of the sheet-like object 10a was coated with a coating material for forming the previously prepared piezoelectric layer 12 using a slide coater. Coating with the coating material was performed so that a thickness of a coating film after drying was 40 μm.

Then, the object obtained by coating the sheet-like object 10a with the coating material was heated and dried on a hot plate at 120° C. so that DMF was evaporated. Thus, the laminated body 10b in which the lower copper electrode 14 was included on the PET lower protective layer 18, and the piezoelectric layer 12 having a thickness of 40 μm was formed thereon was prepared.

The piezoelectric layer 12 of this laminated body 10b was subjected to the polarization process by the above-described corona polling illustrated in FIGS. 4C and 4D. The polarization process was performed by setting the temperature of the piezoelectric layer 12 to 100° C. and applying a DC voltage of 6 kV between the lower electrode 14 and the corona electrode 50 to cause corona discharge.

The sheet-like object 10c was laminated on the laminated body 10b subjected to the polarization process, with the upper electrode 16 (copper thin film side) directed to the piezoelectric layer 12.

Then, a laminated body of the laminated body 10b and the sheet-like object 10c was subjected to thermocompression bonding at 120° C. using a laminator apparatus. Accordingly, the piezoelectric layer 12 was bonded to the lower electrode 14 and the upper electrode 16, such that the conversion film 10 was prepared.

Figure 8:
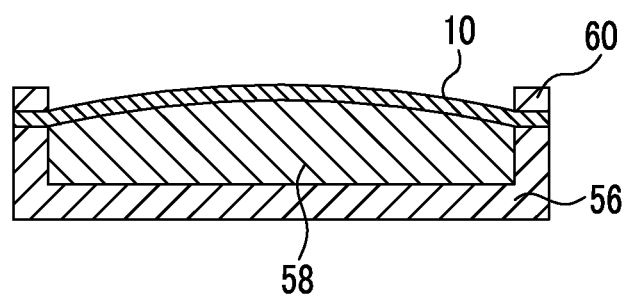
FIG. 8 is a conceptual view of a speaker produced in an embodiment of the present invention.

A rectangular box-shaped case 56 of which one face was opened as illustrated in FIG. 8 was prepared. The case 56 was formed of plastic, a size of an opening is 200×290 mm, and a depth is 9 mm.

As a viscoelastic support of the conversion film 10, a glass wool 58 having a height prior to assembly of 25 mm and a density of 32 kg/m$^3$ was housed in the case 56.

The conversion film 10 was disposed to cover the opening of the case 82 and a periphery thereof was fixed by a frame body 60, and an appropriate tension and curvature was applied to the conversion film 10 by the viscoelastic support 84, such that the speaker as illustrated in FIG. 8 was prepared.

[Speaker Performance Test]

A 3-bit parallel PCM digital signal was input to the first segment 16a, the second segment 16b, and the third segment 16c of the produced speaker, and sound quality was evaluated using sensory evaluation.

The evaluation was performed through sensory evaluation by 20 persons, a case in which the number of persons for which clarity or gradation of sound was evaluated as being good is 18 or more was regarded as evaluation A, a case in which the number of persons is 16 or more and less than 18 was regarded as evaluation B, and a case in which the number of persons is less than 16 was regarded as evaluation C.

The evaluation was A.

Embodiment 2

In the following compositional ratio, polyvinyl acetate (manufactured by Aldrich) was dissolved in dimethylformamide (DMF). Then, PZT particles were added to this solution in the following compositional ratio and dispersed with a propeller mixer (number of revolutions: 2000 rpm) to prepare a coating material for forming the piezoelectric layer 12.

| | |
|---|---|
| PZT particles | 200 parts by weight |
| Poly (vinyl acetate) | 20 parts by weight |
| DMF | 80 parts by weight |

The PZT particles were produced, in the same manner as in Embodiment 1.

The conversion film 10 was produced in the same manner as in Embodiment 1 except that the piezoelectric layer 12 was formed using the coating material.

The same speaker as in Embodiment 1 was produced and evaluated in the same manner as in Embodiment 1. As a result, the evaluation was B.

Comparative Example 1

The upper electrode and the lower electrode were respectively formed at the same positions as in Embodiment 1 through vacuum evaporation using commercially available PVDF having a thickness of 50 μm as a speaker vibration plate, and a conversion film was produced.

The same speaker as in Embodiment 1 was produced and evaluated in the same manner as in Embodiment 1. As a result, the evaluation was C.

It can be seen from the result of Embodiment 1 that in the conversion film 10 of the present invention, there is no reverberation, there is no crosstalk (interference) between the segments, and the parallel PCM digital signal can be suitably reproduced.

Further, in Embodiment 2 using polyvinyl acetate in place of cyanoethylated PVA as a polymer material for forming the piezoelectric layer 12, since a relative dielectric constant at room temperature (25° C.) of the polymer material is lower than that in Embodiment 1, energy conversion efficiency is low and a volume is low, but clarity or gradation of sound is more excellent than in Comparative example. The relative dielectric constant at room temperature of the polymer material is approximately 20 in Embodiment 1 and approximately 3 in Embodiment 2.

On the other hand, in the conversion film of Comparative example 1 using PVDF as a speaker vibration plate, if the parallel PCM digital signal is input, the parallel PCM digital signal cannot be reproduced with high quality due to occurrence of reverberation or crosstalk.

The effects of the present invention are apparent from the above results.

EXPLANATION OF REFERENCES 10, 30, 36, 40: (electro-acoustic) conversion film
12: piezoelectric body
14: lower (thin film) electrode
16, 32, 38, 42: upper (thin film) electrode
16a, 32a, 38a, 42a: first segment
16b, 32b, 38b, 42b: second segment
16c, 32c, 38c, 42c: third segment
16s: gap
50: corona electrode
52: DC power supply
56: case
58: glass wool
60: frame

What is claimed is:

1. An electro-acoustic conversion film, comprising:
a polymer composite piezoelectric body formed by dispersing piezoelectric particles in a viscoelastic matrix formed of a polymer material having viscoelasticity at room temperature, and thin-film electrodes provided on both surfaces of the polymer composite piezoelectric body,
wherein at least one of the thin-film electrodes is divided into a plurality of regions of which an area increases by $2^n$ times (n is a natural number increasing by 1) with the smallest area set to 1, and
wherein a loss tangent (Tan δ) at 100 Hz to 10 kHz at a temperature of 0° C. to 50° C. is 0.09 to 0.35.

2. The electro-acoustic conversion film according to claim 1,
wherein the plurality of divided regions of the electrode are a plurality of annular regions which are concentric to each others.

3. The electro-acoustic conversion film according to claim 2,
wherein the plurality of divided regions of the electrode have a circular region concentric to the annular regions on an inner side of the smallest annular region.

4. The electro-acoustic conversion film according to claim 1, wherein the plurality of divided regions of the electrode are a plurality of radially divided regions.

5. The electro-acoustic conversion film according to claim 4,
wherein the plurality of radially divided regions are radially divided regions in straight lines passing through one point, and the region is formed from two symmetrical regions that are point symmetrical to the one point.

6. The electro-acoustic conversion film according to claim 1, further comprising:
protective layers formed on both surfaces of the thin-film electrode.

7. The electro-acoustic conversion film according to claim 1,
wherein a maximum value at which a loss tangent (Tan δ) at a frequency of 1 Hz from dynamic viscoelasticity measurement of the polymer material is 0.5 or more is present in a temperature range of 0° C. to 50° C.

8. The electro-acoustic conversion film according to claim 1,
wherein a storage elastic modulus (E') at a frequency of 1 Hz from dynamic viscoelasticity measurement of the electro-acoustic conversion film is 10 to 30 GPa at 0° C. and 1 to 10 GPa at 50° C.

9. The electro-acoustic conversion film according to claim 1,
wherein glass transition temperature at a frequency of 1 Hz of the polymer material is 0° C. to 50° C.

10. The electro-acoustic conversion film according to claim 1,
wherein the polymer material has a cyanoethyl group.

11. The electro-acoustic conversion film according to claim 10,
wherein the polymer material is cyanoethylated polyvinyl alcohol.

12. A digital speaker using the electro-acoustic conversion film according to claim 1.

* * * * *